United States Patent [19]

Scifres et al.

[11] Patent Number: 5,088,105
[45] Date of Patent: Feb. 11, 1992

[54] OPTICAL AMPLIFIER WITH FOLDED LIGHT PATH AND LASER-AMPLIFIER COMBINATION

[75] Inventors: Donald R. Scifres; David F. Welch, both of San Jose, Calif.; William Streifer, deceased, late of Palo Alto, Calif., by Shirley R. Streifer, executor

[73] Assignee: Spectra Diode Laboratories, Inc., San Jose, Calif.

[21] Appl. No.: 675,432

[22] Filed: Mar. 26, 1991

[51] Int. Cl.⁵ .............................................. H01S 3/08
[52] U.S. Cl. ........................................ 372/92; 372/93; 372/102; 372/96; 372/20; 372/49; 372/50; 372/69; 372/64
[58] Field of Search ............... 372/92, 93, 96, 102, 372/49, 50, 20, 69, 64

[56] References Cited

U.S. PATENT DOCUMENTS

| | | | |
|---|---|---|---|
| 4,713,821 | 12/1987 | Bradford et al. | 372/44 |
| 4,744,089 | 5/1988 | Montroll et al. | 372/50 |
| 4,751,711 | 6/1988 | Welch et al. | 372/50 |
| 4,762,735 | 8/1988 | Gregoris et al. | 350/92.12 |
| 4,876,539 | 12/1990 | Carlson et al. | 378/96 |
| 5,003,550 | 3/1991 | Welch et al. | 372/50 |

Primary Examiner—Leon Scott, Jr.
Attorney, Agent, or Firm—Schneck & McHugh

[57] ABSTRACT

An optical amplifier having one or more amplifier regions with a noncollinear light path provided by curved or folded waveguides therein between input, output and reflective surfaces provided, for example, by a low reflectivity front facet and a high reflectivity rear facet. The amplifier regions are electrically pumped via conductive contacts which may be individually addressable for each amplifier region to provide phase control of the array of emitted light. Light is accepted through the front facet by a first amplifier region, is reflected from the rear facet and is emitted through the front facet. If there are multiple amplifier regions, a portion of the light is reflected by the front facet into an adjacent amplifier region. The light path is incident on the front and rear facets at an angle other than normal thereto and preferably at most 10° from normal. The light source may be a laser diode which can be monolithically integrated on the same substrate as the amplifier to form a master oscillator power amplifier (MOPA) device. The laser can be wavelength tunable. The MOPA can also have a steerable output beam.

105 Claims, 7 Drawing Sheets

OPTICAL AMPLIFIER WITH FOLDED LIGHT PATH AND LASER-AMPLIFIER COMBINATION

DESCRIPTION

1. Technical Field

The present invention relates to optical amplifiers for amplifying coherent light beams, such as from a semiconductor laser diode, and also to the combination of laser and amplifier known as a master oscillator power amplifier (MOPA) device.

2. Background Art

The master oscillator power amplifier (MOPA) system is one structure that has been studied as having the potential to provide both high power and a diffraction limited single mode output. In U.S. Pat. No. 4,713,821, Bradford et al. describe a MOPA that includes a semiconductor laser diode having an output facet optically coupled to a discrete optical power amplifier. The diode and amplifier are formed together on a single integral crystal, which is then cleaved to form a crack or division between the two. The diode and amplifier are kept in optical alignment with only a slight longitudinal shift resulting from the cleave. In U.S. Pat. No. 4,744,089, Montroll et al. describe a similar MOPA structure which requires no cleaving into separate elements. A laser diode has a periodic grating providing distributed feedback. A power amplifier follows the laser on the same substrate. The laser and amplifier are formed with separate electrical contacts so they can be driven by independent current sources. Montroll et al. achieve a power output of 1 W cw.

In both patents to Bradford et al. and Montroll et al., the amplifiers have a simple flared configuration. The active region at the entrance to the amplifier has the same lateral dimension as the active region at the exit of the laser diode, and the lateral dimension of the amplifier increases linearly in the forward direction away from the laser toward the exit facet. The expanding waveguide enables higher power levels to be reached, but the achievable power levels are still limited by gain saturation toward the end of the amplifier. The amplifier beam coherence at high power is limited by phase distortion caused by such gain saturation and thermal effects. The output facet of the amplifier is antireflection coated to minimize feedback that could cause coherence deteriorating, parasitic oscillations.

Individual optical amplifiers and discrete amplifiers for MOPAs must be mounted so that both facets, for input and output, are accessible, while at the same time the mounts must provide adequate heat sink capability if high power levels are to be achieved. Top-down mounting provides good heat removal from the heat generating areas near the active region, but care must be taken with this type of mounting strategy to prevent overhang of the mount beyond the facet edges to avoid blocking incoming or outgoing light. Thus, this type of mount requires a heat sink which precisely matches the amplifier's length and accordingly very accurate control during manufacturing of the heat sink and amplifier dimensions. Alternatively, the amplifier can be mounted substratedown to avoid the need for precise heat sink dimensions. However, the ability to remove heat is then significantly reduced.

It is an object of the invention to provide a high power coherent light source.

SUMMARY OF THE INVENTION

The above object has been met with an optical amplifier in which an amplification light path is nonlinear, such as by being folded into one or more V-shaped amplifier sections by means of reflection or partial reflection at other than normal incidence off of amplifier front and rear facets. Because the amplification light path is not a linear path intersecting perpendicular to the facets, the light does not retrace the same path, and thus resonance (feedback) is avoided. This enables the amplifier to achieve high power outputs without coherence degrading self-oscillation, even though the amplifier facets do not have high quality antireflection coatings.

In one embodiment, a body of optical gain material has a low reflectivity front facet and a high reflectivity rear facet with at least a first amplifier region defined in the body between the two facets. The amplifier region accepts light, such as a coherent laser light beam, input through the front facet, which then propagates along a light path through the amplifier region of the body toward the rear facet, is incident upon and reflected from the rear facet at an angle other than perpendicular to that facet, and propagates along the remainder of the light path through the amplifier region to the front facet.

The device also includes conductive contacts on top and bottom surfaces of the body of optical gain material for pumping the body to cause amplification of the light propagating in the light path. At least a portion of the now amplified light is emitted from the front facet. Some light may be reflected at the front facet into an adjacent amplifier region, where the process of amplification can be continued. The conductive contacts for providing a pump current can be broad area contacts, or alternatively, on at least one of the surfaces can be disposed only on surface areas that are proximate to the intended light amplification path so as to provide a degree of gain guiding of the propagating light. The body of optical gain material can also include real refractive index waveguides supporting a single mode or multiple modes of propagation.

In the case of amplifiers having plural amplifier regions, the regions can be individually addressed with a different pumping current if on at least the top surface of the amplifier body each amplifier region has a distinct conductive contact that is at least partially electrically isolated from the contacts of adjacent amplifier regions. This individual addressability allows the relative amplitudes and phases of the light outputs from the different amplifier regions to be controlled so as to achieve and maintain coherence. Phase control, either by this means or by means of an external phase shifter, can also be used to sweep the beam in the far field. Furthermore, phase control might be provided by applying a reverse or forward bias voltage to a region of the light path in order to change the charge density along the light path, thereby changing the phase of the output beam, but not to form an amplifier region.

The invention may also include a laser oscillator in combination with the amplifier to form a master oscillator power amplifier device. The laser, amplifier and phase modulator can be integrated on the same substrate with the laser at one end or center of the folded light path.

BRIEF DESCRIPTION OF THE DRAWINGS

FIG. 1b is a front view of the first amplifier embodiment of FIG. 1a.

BEST MODE FOR CARRYING OUT THE INVENTION

Figure 1A:
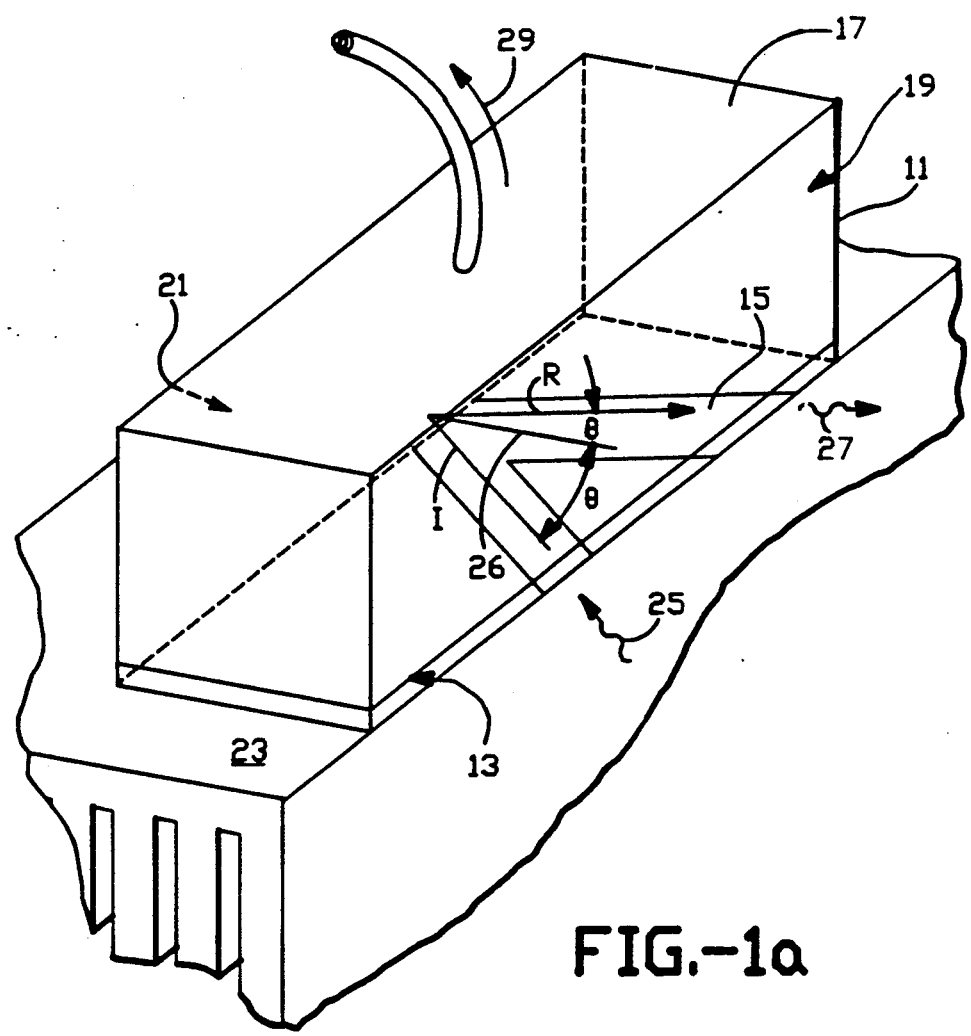
FIG. 1a is a perspective view of a first amplifier embodiment of the present invention.
Figure 1B:
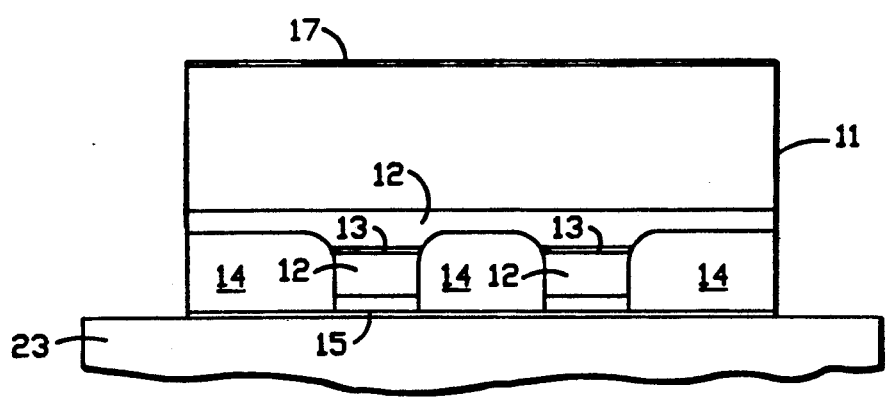

With reference to FIGS. 1a and 1b, an optical amplifier in accord with the present invention includes a body 11 of optical gain material. A front view of a typical heterostructure layer geometry for body 11 is presented in FIG. 1b. Many variations of this structure can be used, including varying compositions, materials and dopants, as well as different waveguiding structures. For example, body 11 may be fabricated from semiconductor heterostructure materials commonly used for laser diodes, such as AlGaAs, InGaAsP, etc., and have an active gain region 13 of one or more semiconductor layers near one surface of body 11 bounded by cladding layers 12 of larger bandgap material. A single quantum well active region of GaAs or InGaAs is preferred for its low transparency current and high saturation power. Other heterostructure or quantum well active regions may also be used. Different waveguide regions 14 may be formed by impurity induced disordering, etch and regrow, implantation or other means.

The amplifier also includes electrically conductive contacts 15 and 17 on respective surfaces of body 11. Contact 15 proximate to active region 13 is a V-shaped contact that provides a pumping current to those portions of the active region along the intended folded or V-shaped light path through the amplifier body 11. Contact 17 on the bottom surface or substrate of the body 11 may be a broad area contact.

The amplifier body 11 has opposed front and rear facets 19 and 21. Front facet 19 is a low reflectivity facet, preferably having an antireflection coating thereon. Due to the special geometry of the light path in this invention, the front facet 19 does not require a high quality antireflection coating. Rather, some residual reflection is permitted. Rear facet 21 is a high reflectivity facet. Preferably, a high quality reflective coating is applied to rear facet 21 to minimize loss of optical power through the back of the amplifier, but this feature is not absolutely essential to its operation. Alternatively, high reflection is obtained if the incidence angle Θ of light on the rear facet 21 is near or exceeds the angle for total internal reflection.

The amplifier is mounted top surface down on a heat sink 23 of beryllia (BeO) or other thermally conductive material. Heat sink 23 may have a metallization pattern that matches V-shaped contact 15 on body 11. Alternatively, the top surface of body 11 can be made electrically insulative or nonconductive in all non-contact areas by selective ion implantation or another known method, such as impurity induced disordering, and heat sink 23 can have a broad area metallization coating on its surface. In either case, an advantage of the present invention is that light is input into and output from the front facet 19 only. Accordingly, the amplifier can be mounted top surface down with the front surface of heat sink 23 aligned with front facet 19 of amplifier body 11. Prior amplifiers having light input and output through opposed front and rear facets required alignment of a heat sink's front and back surface edges with both the front and rear facets of the amplifier to prevent the heat sink itself from blocking the light. This requirement meant that the lengths of the heat sink and amplifier had to be very accurately controlled to provide a precise match. Practical difficulties in attaining precision meant that most amplifiers were mounted junction side up relative to the heat sink, reducing the capability for removing heat from the heat generating active areas of the amplifier.

In operation, coherent light 25, such as a light beam from a semiconductor diode laser, is input into the amplifier body 11 through front facet 19. The light 25 propagates in the amplifier body 11 along an amplification light path, generally following an arm of V-shaped contact 15, toward rear facet 21 where it is reflected. As seen in FIG. 1, light incident on rear facet 21, represented by arrow I, is reflected on to a path, represented by arrow R, which is different from the original light path I. This condition occurs because light I is incident at an angle $\Theta > 0$ relative to the line 26 normal to the rear facet 21. In other words, light is incident on the rear facet 21 at an angle other than perpendicular to that facet. Because of diffraction of light as it leaves the waveguide, an angle Θ of 3° to 5° is preferred to avoid feedback into the original light path. The reflected light path R is also at the angle Θ to the line 26 normal to the rear facet 21 but on the opposite side of line 26. The reflected light propagates toward front facet 19, generally following the other arm of V-shaped contact 15, until at the facet 19 it is emitted as light output 27. The amplifier body 11 may include real refractive index waveguides, not shown, constructed according to any of the known methods used in semiconductor diode laser fabrication, along the intended folded V-shaped light path. Such waveguides may be single or multimode guides, with single mode guides being generally preferred.

The light is amplified as it propagates along the light path through the body 11 of optical gain material. Gain is provided by electrically pumping portions of the active region 13 of the amplifier body 11 along the light path by supplying current 29 between electrical contacts 15 and 17. A change in pumping current can be used to modulate the output 27. Alternatively, one can cause the amplifier to act as a switch with gain by selectively pumping or not pumping the device. When the amplifier body 11 is unpumped, an incident light 25 input into the body 11 is absorbed. When the amplifier body 11 is pumped, the amplifier body becomes transparent and also provides gain.

Figure 2:
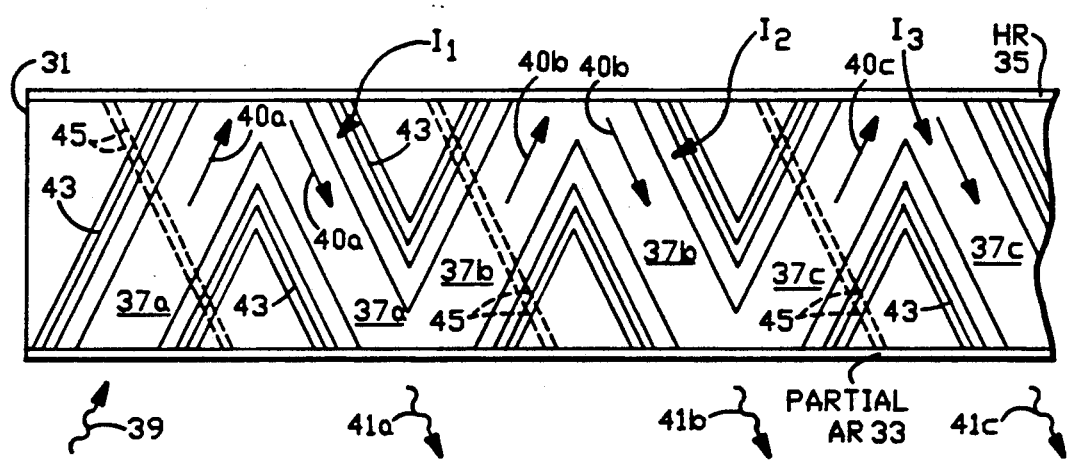
FIG. 2 is a top plan view of a second amplifier embodiment of the present invention.

With reference to FIG. 2, another amplifier according to the present invention comprises an amplifier body 31 of optical gain material, much like amplifier body 11 in FIG. 1, but with more than one amplifier region. Like body 11, amplifier body 31 is typically an AlGaAs semiconductor, single quantum well active region, heterostructure device similar to semiconductor diode lasers. Amplifier body 31 has opposed front and rear facets 33 and 35. Front facet 33 has a low reflectivity coating to make it partially reflecting and partially transmissive. A reflectivity on the order of 5%-10% is typical. Rear facet 35 has a high reflectivity coating like rear facet 21 in FIG. 1.

The amplifier 31 has multiple amplifier regions 37a-c, etc. defined between front and rear facets 33 and 35, and each including a V-shaped real refractive index waveguide. First amplifier region 37a accepts light 39, such as coherent laser light, through the front partially transmissive facet 33. Light 40a propagates in first amplifier region 37a along a folded light path defined by the V-shaped waveguide and is reflected by rear facet 35. Light 40a then continues to front facet 33 where a portion 41a of the light is emitted. Another portion 40b of the light is reflected by the partially reflective front facet 33 into the second amplifier region 37b. Light 40b propagates in second amplifier region 37b along a folded light path defined by the V-shaped waveguide of the second region 37b and is reflected by rear facet 35. Light 40b then proceeds to front facet 33 where one portion 41b is emitted and another portion 40c is reflected into third amplifier region 37c. This process continues for each amplifier region to provide an array of emitted light elements 41a-c, etc.

The light 40a-c, etc. propagating in the amplifier regions 37a-c, etc. is incident upon the rear facet 35 at an angle other than normal to the rear facet so that the reflected light follows a different light path than the incident light. Typically, the incidence angle may be 5°-10°, but up to 45 degrees or greater away from normal may be used. Likewise, the light 40a-c propagating toward the front facet 33 is incident at an angle other than normal to the front facet 33 so that reflected light is injected into the adjacent amplifier region. Thus, the propagating light 40a-c, etc. describes a zig-zag bounce pattern laterally across the amplifier 31. Grooves 43 may be defined in the amplifier 31 adjacent to the waveguides of each amplifier region in order to suppress lasing in the lateral direction.

As in FIG. 1, a single contact or current level may be used as the excitation source of the amplifier. In this case, an external phase shifting device, such as a liquid crystal array, may be used to provide for beam steering. Alternatively, the amplifier 31 is electrically pumped, as shown in FIG. 2, by injection of current $I_1$, $I_2$, $I_3$, etc. into individually addressable pumping regions, demarcated by dashed lines 45 in FIG. 2. The conductive pattern can be formed on the amplifier body itself by photolithography and proton implantation of the p-side semiconductor crystal, rendering it insulating in the implanted regions. The separate contacts may be established by a conductive contact pattern formed on a BeO or other heat sink mount and placed on the junction side of amplifier 31, like heat sink 23 and amplifier 11 in FIG. 1. The amplifier may also be mounted junction up on the heat sink with separate wires contacting each amplifier region. By adjusting the currents $I_1$, $I_2$, $I_3$, etc. supplied to each of the pumping regions, the gain and phase of the output light elements 41a-c, etc. can be adjusted to provide a coherent beam. Only small changes in the currents $I_1$, $I_2$, $I_3$, etc. may be required to adjust the phase, if the path lengths of the amplifier regions 37a-c, etc. are long. Typical lengths between front and rear facets 33 and 35 are on the order of 200 μm or longer. Large current changes can then be used to adjust gains, while small differential changes can be used to fine tune the phases of the individual emitters. As a further alternative, one or more forward or reverse biased contact segments per amplifier region, as in FIG. 6, may be used to adjust the array amplitude and phase.

The amplifier array in FIG. 2 can be stacked vertically with like arrays to form a 2-D amplifier array. Stacking can be done with the constructions described in U.S. Pat. No. 4,716,568 for laser arrays. The phase of each amplifier can be individually tuned, while the injection laser source may be either a single laser beam split between the various amplifier arrays or multiple beams from a phase-locked diode laser array.

Figure 3:
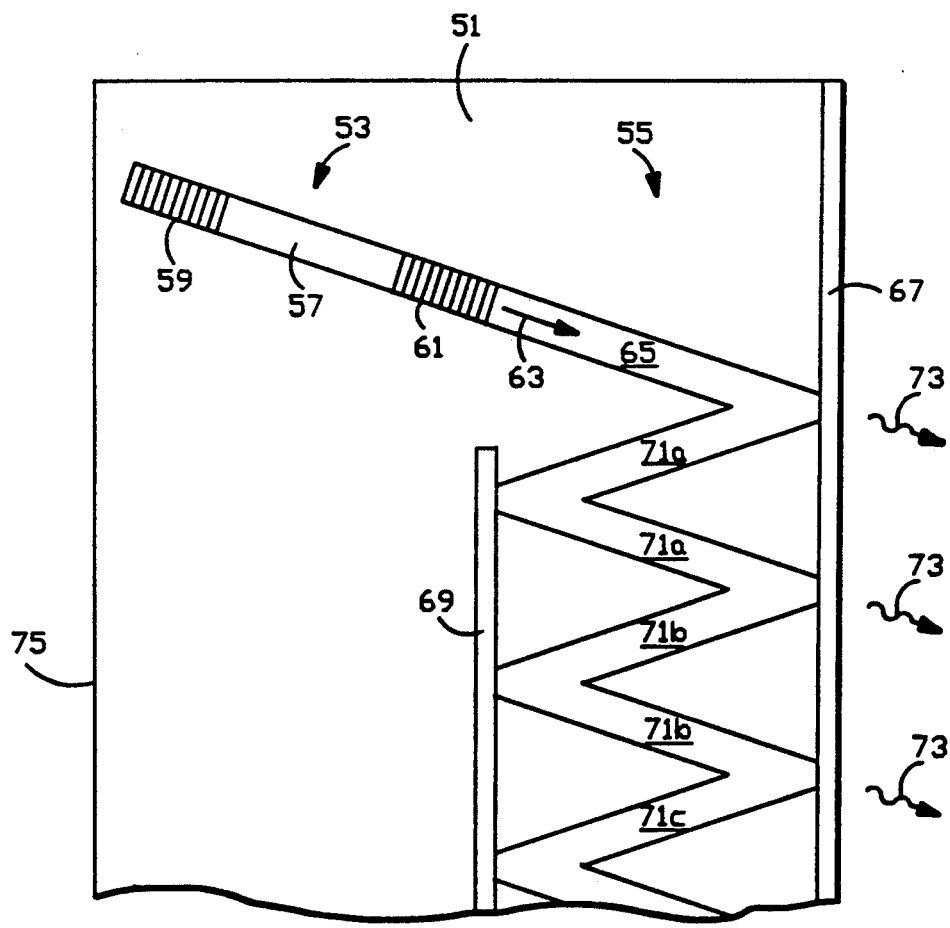
FIG. 3 is a top plan view of a master oscillator power amplifier device (MOPA) of the present invention.

With reference to FIG. 3, a MOPA structure 51 includes a laser 53 and an amplifier 55 integrated on a common substrate. Laser 53 has an electrically pumped active region 57 for lightwave generation. Associated with the active region 57 is a waveguide which supports a single spatial mode of lightwave propagation. Lightwaves may be gain guided, real refractive index guided or both. Distributed Bragg reflectors 59 and 61 provide feedback at each end of the pumped gain section 57. Other reflector means, such as etched or cleaved facets or distributed feedback (DFB), can also be utilized. Rear reflector 59 may be a relatively long grating to provide a high effective reflectivity, preferably 90% or more. Because of its length, rear grating reflector 59 also provides a narrow band reflection with strong frequency selectivity. Injecting a controlled amount of current into the device in the region of the rear reflector 59 can thus be used to tune the wavelength of the laser light. This will have the effect of scanning the phase (and direction) of the output beam. Front reflector 61 is relatively short to enhance transmission to the amplifier 55. An effective reflectivity of less than 30% is preferred.

The amplifier 55 includes a zig-zag pattern of waveguides 65, 71a-c, etc. and front and rear reflector facets 67 and 69. Waveguide 65 receives light 63 emitted from laser 53, which propagates toward the partially reflecting, partially transmitting front facet 67. Waveguide 65 may be pumped to provide amplification of the light 63. A portion of the light incident on facet 67 is reflected into the first V-shaped amplifier region 71a, in which the light path is folded by reflection off of rear facet 69. After completing one folded amplifier path, a portion 73 of the light is emitted and another portion is reflected into the next folded amplifier region 71b. This continues for each amplifier region. Typically, there may be about 20 amplifier regions 65, 71a-c, etc. Typically, the output spacing of the arrays for coherent single lobed emission may be on the order of 10 μm, but much larger spacings may also be used. The light output is an array of light elements 73. Phase and gain of each light element 73 may be adjusted as in FIG. 2. Rear reflector 69 may be etched into the MOPA structure 51, or may be a distributed Bragg reflector tuned to reflect the same wavelength as laser reflector 59. Alternatively, the folded amplifier waveguides 71a-c may be extended to the rear facet 75 of the MOPA structure 51.

As noted, the MOPA structure 51 in FIG. 3 may have amplifier regions 71a-c, etc. which are individually addressed to provide phase and gain adjustment. In both FIGS. 2 and 3, the near field light emission 41 and 73 is at an angle, typically not more than 10° away from normal, to the front facets 33 and 67. However, because phases of the individual light elements 41 and 73 can be adjusted the far field radiation pattern can have a single lobe normal to the facets 33 and 67, if the light elements are all in phase, or can be laterally steered by introducing a phase shift in the light elements. The amplifier array structures in FIGS. 2 and 3 overcome the power limitations of the prior flared waveguides used in MOPAs by removing a portion of the light from the waveguide as an output as or before gain saturation, which induces wavefront distortion, is reached. Also, if the amplifier waveguides are single transverse mode waveguides a wavefront distortion cannot occur or is greatly reduced.

Figure 4:
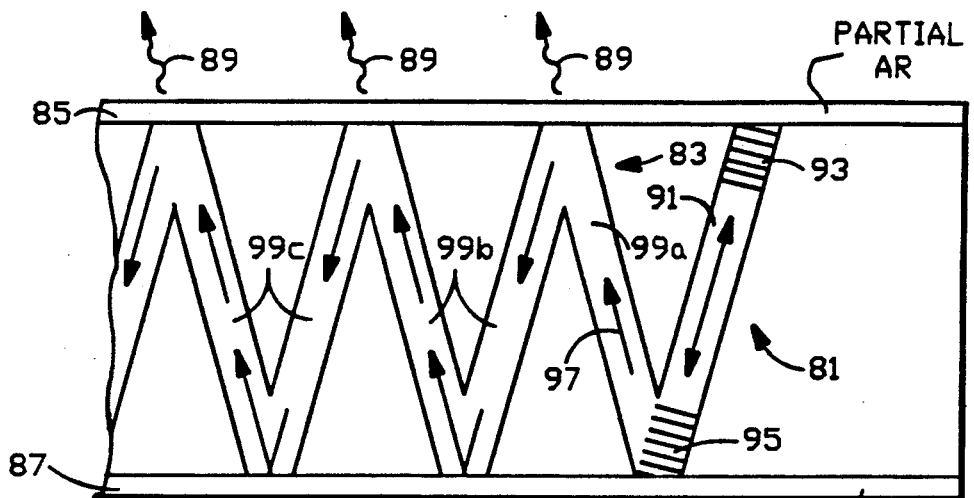
FIGS. 4-9 and 16 and 19 are top plan views of other MOPA devices of the present invention.

With reference to FIG. 4, a monolithic MOPA array device includes a laser 81 and an amplifier array 83 with a folded light path between front and rear facets 85 and 87 to produce an array of emitted light elements 89. As in FIG. 3, the laser 81 has an electrically pumped gain region 91 bounded by Bragg reflector gratings 93 and 95 for providing resonant feedback to produce a laser beam 97. Preferably, grating 93 will have a higher reflectivity than grating 95 in order to allow efficient coupling of laser light into the first amplifier region 99a. The laser beam 97 is reflected off of the highly reflective front facet 85 at one end of laser 81 into a first amplifier waveguide 99a. Each waveguide segment of amplifier regions 99a, 99b, 99c, etc. extends the entire length of the device from front facet 85 to rear facet 87 and forms part of a folded or "zig-zag" light path. Light in the waveguide path incident on high reflectivity front facet 85 is substantially reflected into an adjacent amplifier segment, while light in the waveguide path incident on the partial reflectivity rear facet 87 is partially reflected into an adjacent amplifier segment of the next amplifier region 99b, 99c, etc. and partially emitted as array light output elements 89. Each amplifier region 99a, 99b, 99c, etc. is pumped to cause amplification of light propagating along the light path in that amplifier region, for example, by one or more electrical contacts on top and bottom surfaces of the device.

Figure 5:
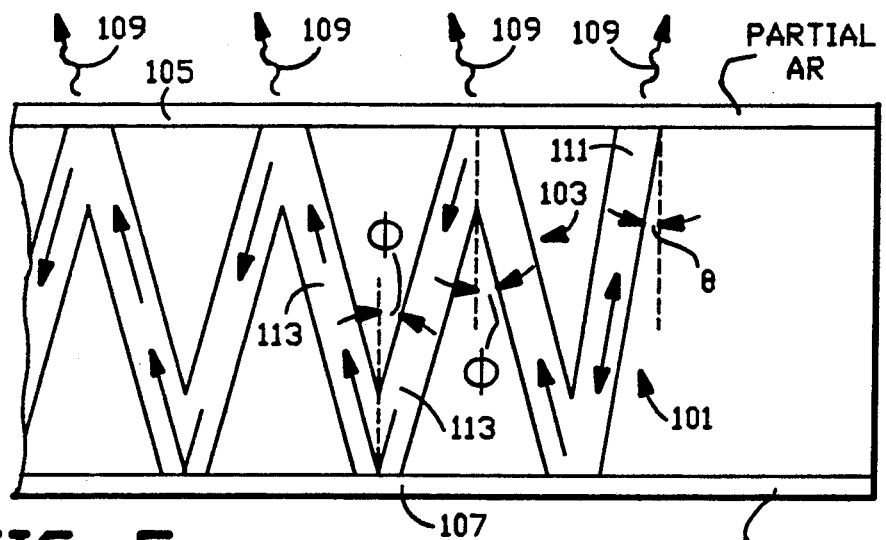

With reference to FIG. 5, a monolithic MOPA array device includes a laser 101 and an amplifier array 103 with a folded light path between rear high reflectivity facet 105 and front partial reflectivity facet 107 to produce an array of emitted light output elements 109 through front facet 107. The structure is the same as that shown in FIG. 4 just described, except for the structure of laser 101. Instead of having the Bragg reflectors 93 and 95 of FIG. 3, the laser 101 relies on the facets 105 and 107 for providing feedback. The laser waveguide 111 is perpendicular or nearly perpendicular to facets 105 and 107. A skew angle $\Theta$ of the waveguide 111 from perpendicular on the order of 3° or less is preferable, because at $\Theta > 3°$, very little feedback into the laser 101 occurs. In contrast, feedback in the amplifier 103, such that light returns going the wrong direction back toward the laser 101, is not desired. Accordingly, twice the skew angle $\phi$ of the amplifier waveguide elements 113 relative to the facets 105 and 107 on the order of 4°, i.e. $\phi > 2°$, is preferable. However, the skew angle $\phi$ must not be greater than the angle of total internal reflection (approximately 15° for GaAs—air boundaries), so that light 109 may be emitted.

Figure 6:
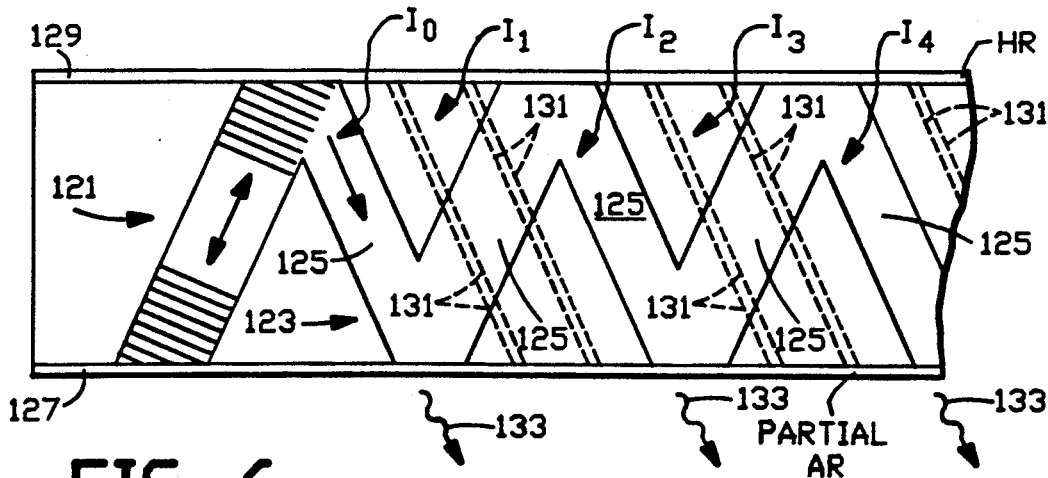

With reference to FIG. 6, a monolithic MOPA array device has a laser 121 followed by an amplifier 123 with a folded waveguide 125 between front and rear facets 127 and 129. The structure is like the MOPA device shown in FIG. 2, except that there are more individually addressable electrical contacts, demarcated by dashed lines 10 131, for supplying currents $I_0-I_4$, etc. Gain and phase adjustment functions of the currents $I_0-I_4$, etc. have been more fully separated to provide better control over the array of emitted light elements 133. Currents $I_0$, $I_2$ and $I_4$ are pump currents which supply gain to the laser 121 and amplifier 123, the laser 121 and the first amplifier region being supplied a first individually addressed current $I_0$, the second amplifier region being supplied a second individually addressed current $I_2$, the third amplifier region being supplied a third individually addressed current $I_4$, etc. so that the relative amplitudes of the outputted light elements 133 are individually specified. Currents $I_1$, $I_3$, etc. are phase adjustment currents supplied to the amplifier 123, first phasing current $I_1$ being supplied to a portion of the light path in the second amplifier region to adjust the relative phase of the propagating light between the first and second amplifier regions, second phasing current $I_3$ being supplied to a portion of the light path in the third amplifier region to adjust the relative phase of the propagating light between the second and third amplifier regions, etc. so that the relative phases of the output light elements 133 are specified. The separate phase adjustment currents $I_1$, $I_3$, etc. allow phasing more completely independent of power control. Certain segments of the light path may also contain reverse biased phase modulators. A variety of such modulators are known in the art.

Figure 7:
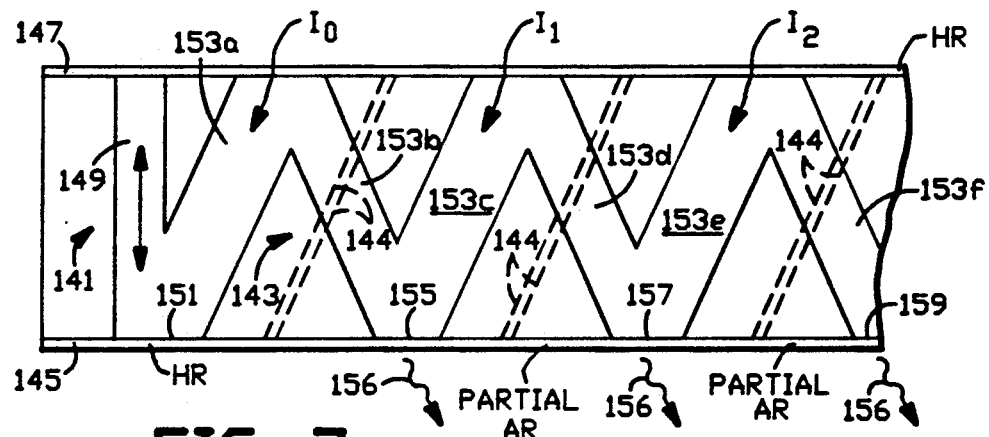

With reference to FIG. 7, another monolithic MOPA array device includes a laser 141 and a folded waveguide amplifier 143 between front and rear facets 145 and 147. Laser 141 is like the laser 101 in FIG. 5 in that the laser's resonant cavity is defined by reflective feedback from front and rear facets 145 and 147. Rear facet 147 is highly reflective, while the reflectivity of front facet 145 varies with lateral position, being highly reflective in area 151 in front of laser waveguide 149. A portion of the light propagating a laser waveguide 149 couples into amplifier waveguide segment 153a, where it propagates toward rear facet 147, is reflected by facet 149 into amplifier waveguide segment 153b, and propagates toward front facet 145. Region 155 of front facet 145 is partially reflective, so a portion 156 of the light from waveguide segment 153b is emitted. The remainder of the light from waveguide segment 153b is reflected by front facet 145 and couples into amplifier waveguide segment 153c of a second amplifier region. This reflected light in waveguide 153c is reflected by rear facet 147 into amplifier waveguide segment 153d toward front facet 145. The portion 157 of front facet 145 is also partially reflective, so that a portion 156 of the light from waveguide 153d is emitted, while another portion is reflected into amplifier waveguide segment 153e of a third amplifier region. Light received from waveguide 153f and propagating in amplifier waveguide segment 153f is likewise partially transmitted through and partially reflected by region 159 of facet coating 145. The front facet coating 145 can be made highly reflective in region 151 and partially reflecting in regions 155, 157, 159, etc. by forming it with a controlled asymmetric growth. The device may have individually addressable electrical contacts, demarcated by dashed lines 144 in FIG. 7, to adjust the relative amplitudes and phases of the array of emitted light elements 156, in particular to compensate for differences in reflectivity between coated facet portions 155, 157, 159, etc.

Figure 8:
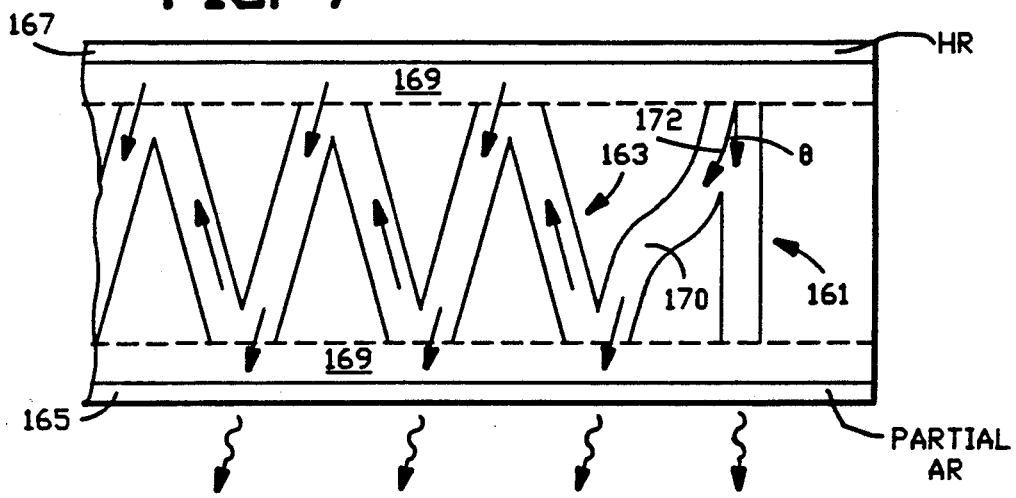

With reference to FIG. 8, a monolithic MOPA array device includes a laser 161 and a folded waveguide amplifier 163 located between front and rear facets 165 and 167 of a common semiconductor body. Rear facet 167 has a high reflectivity coating, while front facet 165 is partially reflective. In this embodiment, transparent unpumped window regions 169 are formed in the light path immediately adjacent to facets 165 and 167. Window regions 169 can be formed by any of the known techniques of forming such window regions in semiconductor laser diodes and diode laser arrays, e.g. by increasing the bandgap of the material in the regions 169 relative to that in the active region of laser 161. Window regions 169 prevent degradation of the facets 165 and 167 at high power densities, thereby enabling higher power outputs to be achieved. Another feature of the embodiment is that the amplifier waveguide 170 that receives the laser light 172 from the laser 161 is curved to better couple the laser power to the amplifier 163. Curving the waveguide 170 allows for a shallower initial coupling angle $\Theta$ to the laser 161.

Figure 9:
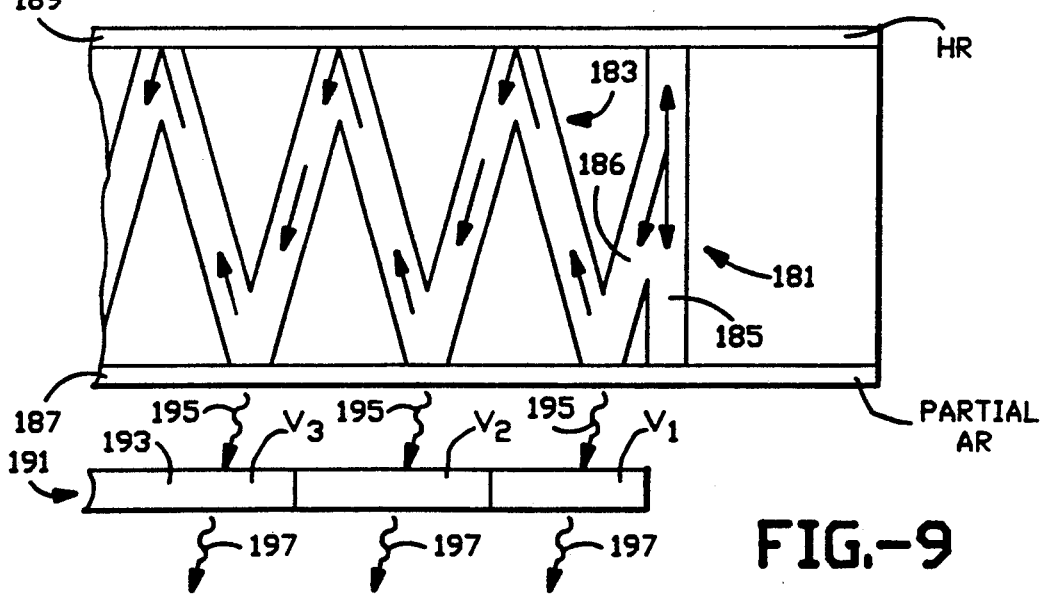

With reference to FIG. 9, a monolithic MOPA array device includes a laser 181 and a folded waveguide amplifier 183. The laser 181 includes a waveguide 185 which branches or curves into an angled amplifier waveguide 186 in the central region of the laser 181. Coupling of optical energy into the amplifier 183 preferably occurs at the central region of the laser 181 rather than at either facet 187 or 189. This coupling arrangement can be used in the other described embodiments as well. Note that the partially AR coated front facet can be coated with an angle sensitive stack reflector so as to be highly reflective for light incident at 0° (the laser) and be partially AR coated at the amplifier angle of incidence. The device also includes a liquid crystal array 191 placed in front of front facet 187. Array 191 has a plurality of light transmitting cells 193 in which either the refractive index (phase) or the transmissivity is controlled by the voltage $V_1$, $V_2$, $V_3$, etc. applied to each cell 193. Light elements 195 emitted by the amplifier array 183 are incident on the cells 193. The light output 197 from the liquid crystal array 191 is thus modulated by the array in either phase or amplitude or both.

Figure 10:
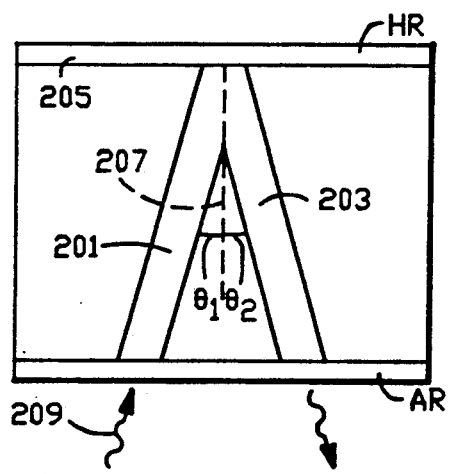
FIGS. 10-15, 17, 18, 20 and 21 are top plan views of other amplifier embodiments of the present invention.

With reference to FIG. 10, a folded waveguide amplifier like that shown in FIG. 1 demonstrates that the waveguides 201 and 203 need not be oriented at exactly the same angle with respect to a facet 205. Waveguide 201 is oriented at an angle $\Theta_1$ with respect to the perpendicular line 207 to rear facet 205, so that incoming light 209 is incident on rear facet 205 at about angle $\Theta_1$. Waveguide 203 is oriented at an angle $\Theta_2$ with respect to perpendicular line 207. Angles $\Theta_1$ and $\Theta_2$ need not be equal for light coupling between waveguides 201 and 203 to take place. Rather, due to light diffraction, significant coupling will occur if $\Theta_2$ is within about 2° from $\Theta_1$, i.e. $\Theta_1 - 2° < \Theta_3 < \Theta_1 + 2°$.

Figure 11:
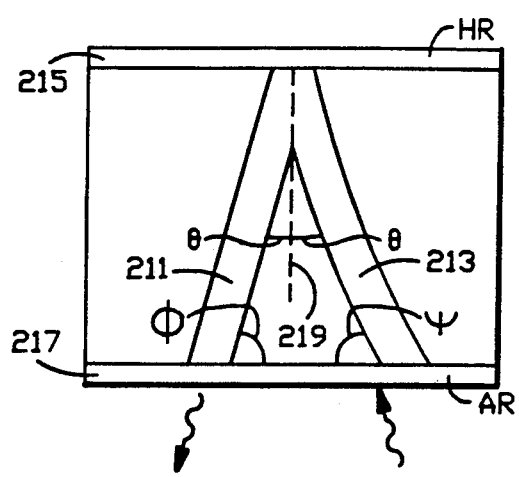

With reference to FIG. 11, a folded waveguide amplifier, similar to that shown in FIG. 1, demonstrates that not all amplifier waveguides 211 and 213 need be straight. Rather, waveguide 213 is curved. A reason why curved waveguides might be desired is to vary the angle of incidence of the light path against the facets. For example, here both waveguides 211 and 213 are oriented at an angle 8 with respect to a perpendicular line 219 from rear facet 215. However, the angles $\phi$ and that waveguides 211 and 213 make against front facet 217 are not identical because of the curvature of waveguide 213.

Figure 12:
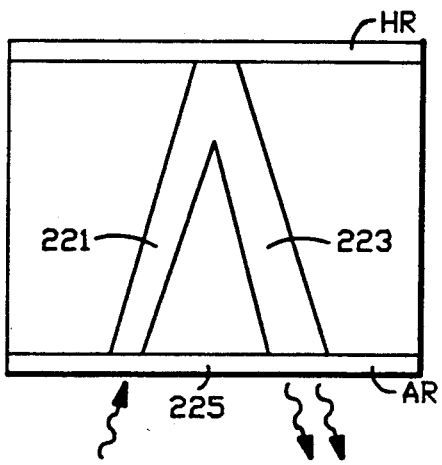

With reference to FIG. 12, another folded waveguide amplifier, similar to that shown in FIG. 1, demonstrates that the waveguides need not have constant width. Here, both waveguide segments 221 and 223 are flared so as to increase in width along the light path. Such a structure prevents gain saturation for long amplifier waveguide paths to an output region 225. The rate of waveguide flare or width increase should not exceed that due to diffraction of light propagating in those waveguides 221 and 223. The rate of waveguide flare need not be constant over the entire amplifier light path. All or part of one or the other waveguide 221 or 223 may have constant width, that may be unflared, while other parts may exhibit flare.

Figure 13:
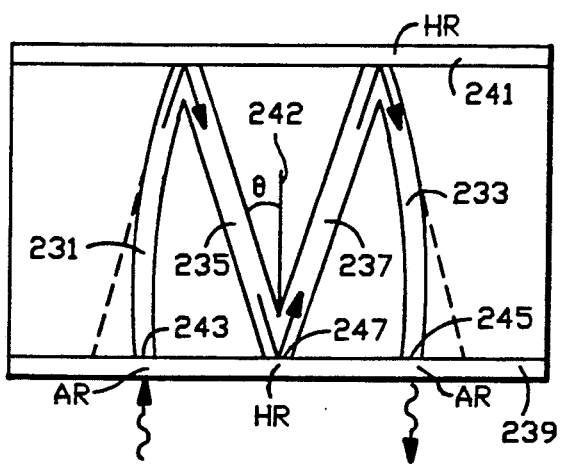

With reference to FIG. 13, a folded waveguide amplifier makes use of curved waveguides 231 and 233 to provide a different angle of incidence of these waveguides at front facet 239 from the incidence angles of the same waveguides at rear facet 241 or of waveguides 235 and 237 at both facets 239 and 241, whereby the light path is made longer and the separation between light input and output regions 243 and 245 are increased. Waveguides 235 and 237 are oriented at an angle $\Theta$ with respect to a perpendicular line 243 from front facet 239. If angle $\Theta$ is greater than the critical angle for total internal reflection then light traveling in waveguide 235 and incident in region 247 on front facet 239 will be highly reflected into waveguide 237, even if the coating on facet 239 is antireflective over the entire facet surface. Alternatively, region 247 of front facet 239 may have a high reflectivity coating, while other regions of front facet 239 may be antireflective or partially reflective. In the case where angle $\Theta$ is greater than the critical angle, curving waveguides 231 and 233 reduces the angle of incidence of these waveguides at front facet 239 such that total internal reflection does not take place. Light is accepted through front facet 239 in region 243 into waveguide 231 and emitted from waveguide 233 through region 245 of front facet 239. The structure allows one to physically separate the input and output regions 243 and 245 by a larger distance than that possible by a single fold in the light path. Such a structure thus can provide ease in fiber input and output coupling.

Figure 14:
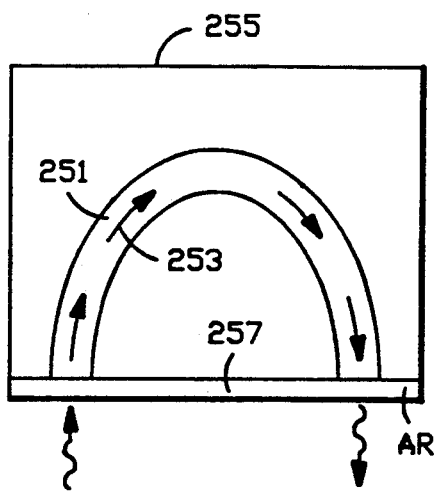
Figure 15:
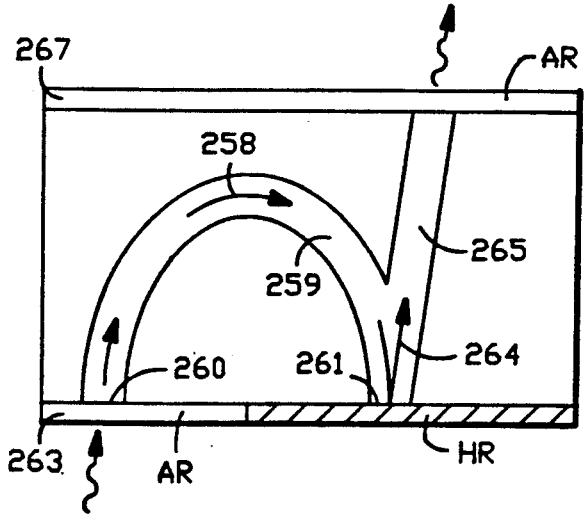

With reference to FIGS. 14 and 15, optical amplifier devices demonstrate that the light path need not be a series of straight waveguide segments coupled by reflection from a high reflectivity or partially reflective facet to provide a noncollinear path. In FIG. 14, amplifier waveguide 251 is curved approximately into a semicircular or U-shape so that light 253 undergoes a 180° change of direction without reflection from rear facet 255. Real refractive index waveguides are generally preferred in this case to minimize propagation loss. Light to be amplified is input and amplified light is output through antireflection coated front facet 257. In FIG. 15, light 258 propagating in a curved amplifier waveguide 259 from a front facet input area 260 is incident on an area 261 of front facet 263, where a portion 264 of the light is coupled by partial reflection off of front facet 263 into a waveguide segment 265. From region 261, light 264 coupled into waveguide 265 propagates toward antireflection coated rear facet 267, where it is emitted. This embodiment may be used where good control over amplifier device and heat sink mount lengths can be achieved, or in low power applications that do not require junction-side down mounting.

Figure 16:
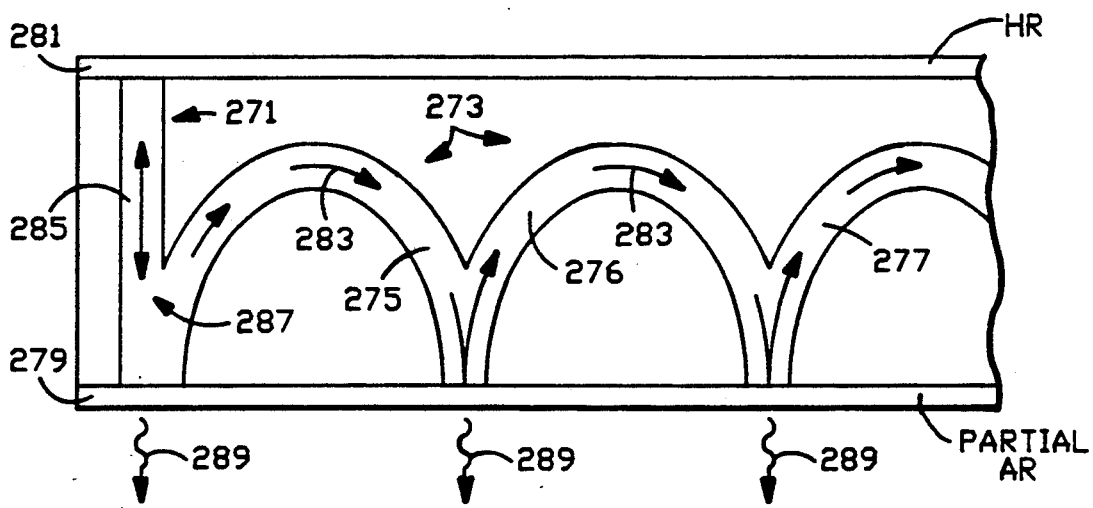

With reference to FIG. 16, a monolithic MOPA array device includes a laser 271 and an amplifier 273 having a series of curved waveguides 275-277, etc. between front and rear facets 279 and 281. The curved waveguides 275-277 embody the amplifier principles of FIGS. 14 and 15, having a semicircular or U-shape to turn the direction of propagating light 283 by 180° over the length of a waveguide. Waveguides 275-277 do not contact rear facet 281, the light path being bent by the strong waveguiding carried out by the waveguides 275-277, rather than by reflection from rear facet 281. Light from one waveguide is coupled into an adjacent waveguide by reflection off of partially reflective front facet 279. Laser light propagating in laser waveguide 285 between front and rear facets 279 and 281 in a resonant condition may be coupled into the first amplifier waveguide 275 by a branching of waveguides in the central region 287 of laser 271. Amplified light elements 289 are emitted from the laser 271 and each of the amplifier waveguides 275-277, etc. at the partially reflective front facet 279.

Figure 17:
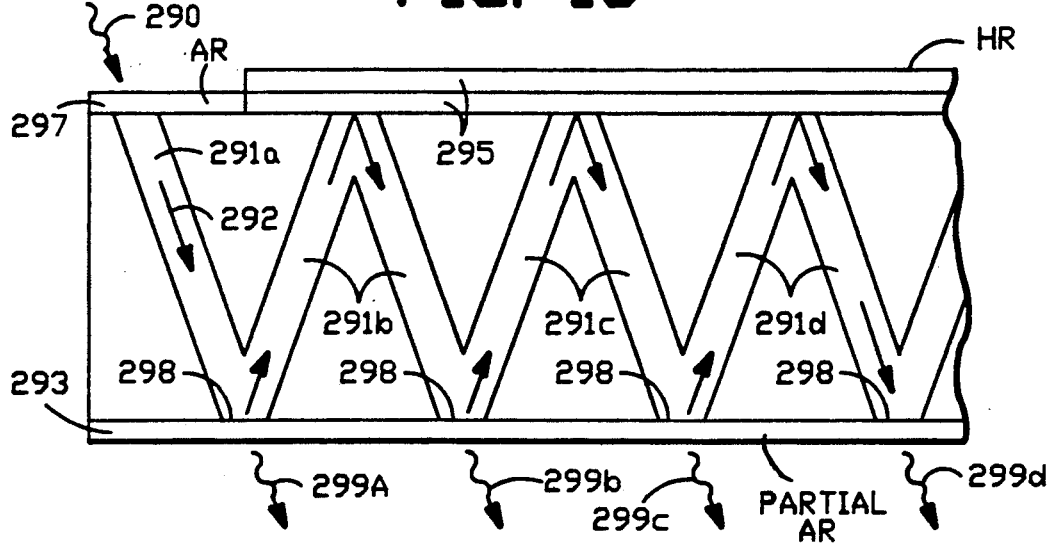

With reference to FIG. 17, an optical amplifier array device is like that shown in FIG. 2, except that the light input region 297 is on the rear facet 295 while the array light output regions 298 is on the opposite front facet 293. The amplifier array has a series of amplifier regions 291a-d, etc., made up of electrically pumped amplifier waveguide segments. A first amplifier region 291a receives light 290 through an antireflection coated input portion 297 of rear facet 295. The remainder of rear facet 295 is highly reflective. The light 292 in the waveguide of first amplifier region 291a is partially reflected into a second amplifier region 291b and partially transmitted through the front facet 293 to form a first emitted light element 299a. Light propagating in the waveguides of the second amplifier region 291b is substantially reflected from high reflectivity rear facet 295 and then partially reflected and transmitted at front facet 293. The portion reflected couples into a third amplifier region 291c, while the portion transmitted forms a second emitted light element 299b. Similarly, other light elements 299c, 299d, etc. are emitted from amplifier regions 291c, 291d, etc. Pumping of the amplifier regions may be done through any of the electrical contacts described for FIGS. 1, 2 and 6.

Figure 18:
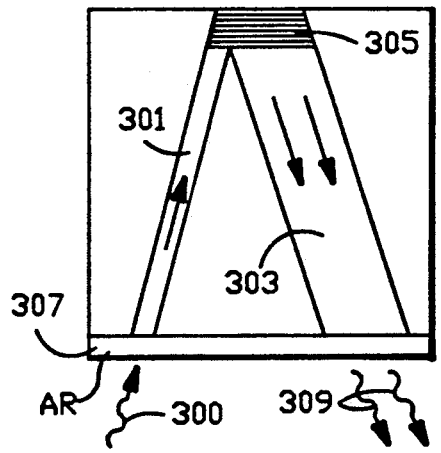
Figure 19:
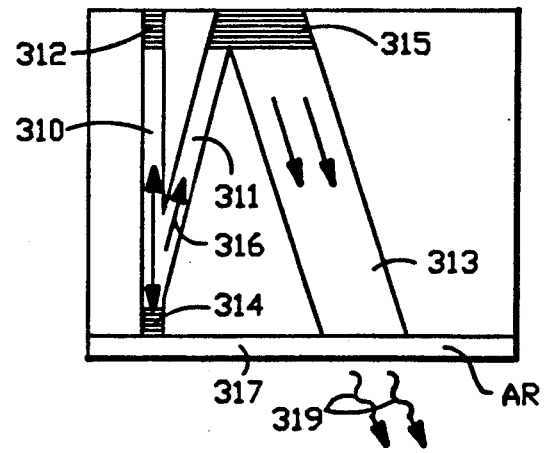

With reference to FIGS. 18 and 19 an amplifier device and an integrated MOPA device illustrate that a single mode waveguide 301 or 311 need not couple light by reflection into another single mode waveguide, but can instead couple light into a broad area (multimode) waveguide 303 or 313. In FIG. 18, single mode waveguide 301 accepts a light input 300 through antireflection coated front facet 307. The light propagating in waveguide 301 is reflected (diffracted) into broad area waveguide 303 by a Bragg reflector grating 305 at a rear end of waveguides 301 and 303. The grating period at the intersection of waveguides 301 and 303 is chosen to diffract light propagating in waveguide 301 at the proper angle to efficiently couple into 303. The light propagating in waveguide 303 is emitted through front facet 307 in the form of a light beam 309. Waveguides 301 and 303 form a folded amplification light path and are electrically pumped to provide gain to the input light 300. As a result, the light beam 309 emerging from waveguide 303 has been amplified in intensity several fold relative to the input light 300. In FIG. 19, a laser having a waveguiding active gain region 310 bounded by grating Bragg reflectors 312 and 314 for feedback provides a laser beam 316 to single mode amplifier waveguide 311. Coupling of the laser waveguide 310 to the amplifier waveguide 311 may be done by branching of the waveguides 310 and 311 in the central portion of the laser. The light propagating in amplifier waveguide 311 is reflected (diffracted) into the broad area waveguide 313 by a grating reflector 315 at a rear end of waveguides 311 and 313, the angle of diffraction being dependent on the internal lasing wavelength and the grating period The light 319 is then emitted from broad area waveguide 313 through an antireflection coated front facet 317. Electrical pumping of the laser and amplifier regions may be done by any of the electrical contact constructions described for FIGS. 1, 2 and 6. The broad area waveguides 303 and 313 permit output over a wide region, thus enabling larger total power outputs to be attained without front facet degradation. A coherent single lobed diffraction limited output beam may also be obtained.

Figure 20:
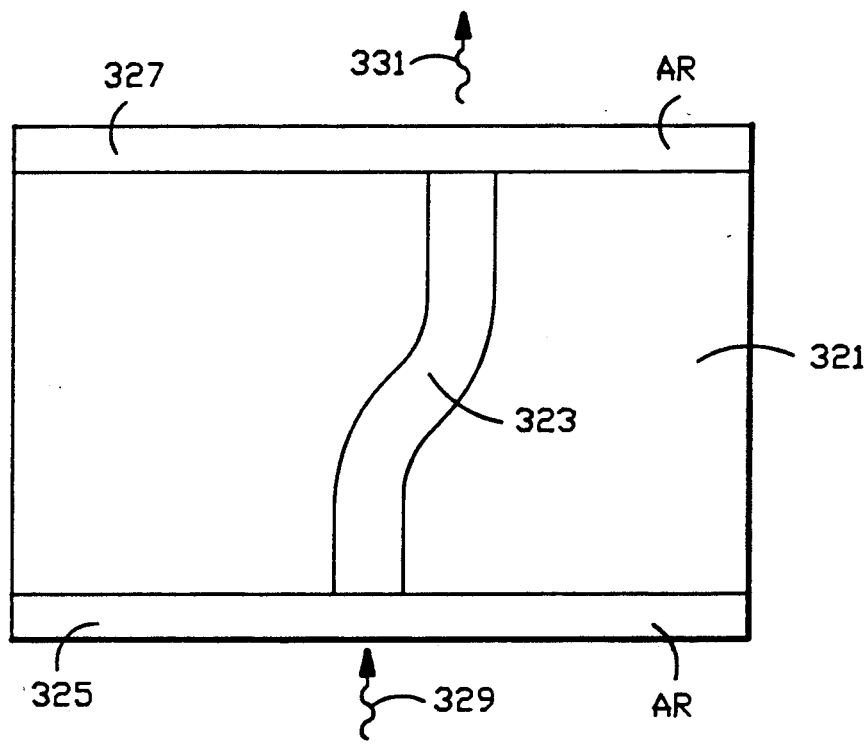

With reference to FIG. 20, an optical amplifier includes a body 321 of optical gain material having a front low reflectivity facet 325 with an input region for accepting input light 329, having a rear low reflectivity facet 327 with an output region for emitting light output 331, and having an amplifier region defined within the body 321. Preferably, facets 325 and 327 are antireflection coated. A waveguide 323 provides a nonlinear light path within the body 321 passing through, or typically coextensive with, the amplifier region. Here the waveguide 323 is curved or bent so that there is no straight line path within the waveguide 323 for light 329 from input facet 325 to output facet 327. Light is admitted and emitted perpendicular to the facets 325 and 327. Waveguide 323 is preferably a single transverse mode waveguide and could be either a real refractive index waveguide or a gain guide defined by spatially confined pump current. The device is electrically pumped through conductive contacts on top and bottom surfaces of the body 321 to cause amplification of light propagating in the guided light path 323. Amplified light 331 is emitted from the output facet 327.

Figure 21:
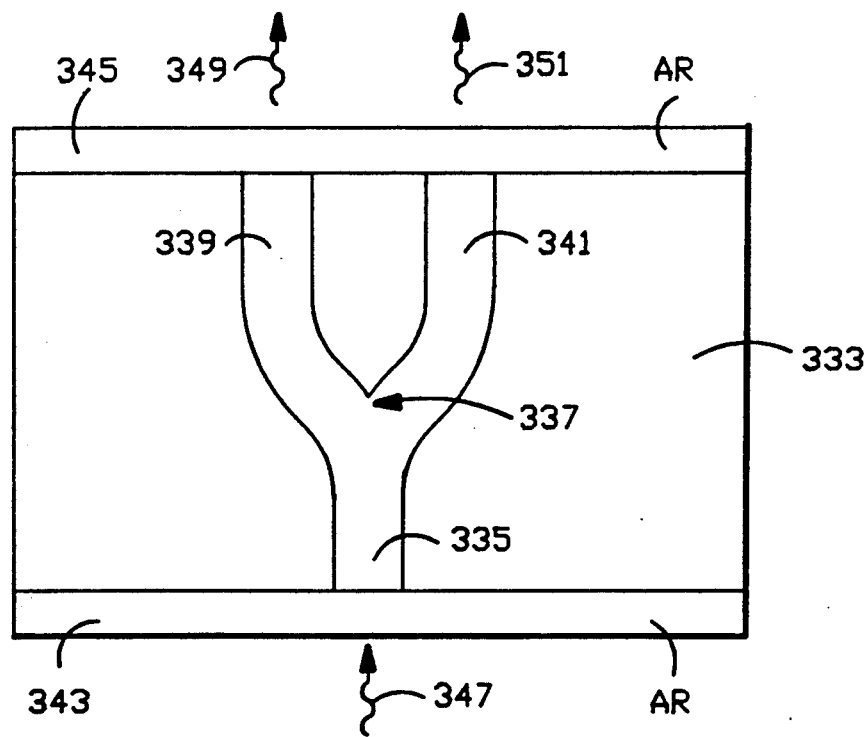

With respect to FIG. 21, an optical amplifier includes a body 333 of optical gain material having a front low reflectivity facet 343 with an input region for accepting input light 347, having a rear low reflectivity facet 345 with two output regions for emitting a pair of phase coupled light output beams 349 and 351, and having an amplifier region defined within the body 333. Preferably, facets 343 and 345 are antireflection coated. A branched Y-shaped waveguide, having a Y-base 335, a branch region 337, and two Y-arms 339 and 341, provides a nonlinear light path with the body 321 passing through, or typically coextensive with, the amplifier region. The waveguide curves or bends at the branch region 337 so that there are no straight line paths for light 347 from input facet 343 through either Y-arm 339 or 341 to rear output facet 345. Light is admitted and emitted perpendicular to facets 343 and 345. The branched waveguide is preferably a single transverse mode waveguide in all segments 335, 337, 339 and 341, and could be a real refractive index waveguide or a gain guide defined by spatially confined pump current. The device is electrically pumped through conductive contacts on top and bottom surfaces of the body 333 to cause amplification of light propagating in the guide light paths 335, 337, 339 and 341. Amplified light 349 and 351 is emitted at the rear facet 345 from both Y-arms 339 and 341. Each arm 339 and 341 of the branched waveguide could also be pumped with individually addressable electrical contacts so as to provide relative phase control between the two beams 349 and 351 of emitted light. Amplitude control of the two beams could also be provided by separate pumping of each arm so that one input signal could be switched between the two output ports. These output ports might then be coupled to optical fibers.

We claim:

1. An optical amplifier device comprising:
   a body containing at least one optical gain region having an input region and at least one output region, said body having at least a first amplifier region defined within said body, said first amplifier region accepting a light input at said input region,
   means for providing a nonlinear light path within said body, at least a portion of said light path passing through said first amplifier region,
   means for pumping said body of optical gain regions to cause amplification of light propagating in said light path, at least a portion of said amplified light being emitted from said output region or regions of said body.

2. The device of claim 1 wherein said body is a semiconductor amplifier.

3. The device of claim 1 further comprising means for adjusting the phase of amplified light being emitted from said at least one output region.

4. The device of claim 3 including means for sensing and adjusting the output phase to create a single lobed output beam.

5. The device of claim 1 wherein the output beam or beams are electronically steerable.

6. The device of claim 1 further comprising an external phase shifter in the path of said emitted light for adjusting the phase of said emitted light.

7. The device of claim 1 wherein said means for providing a nonlinear light path includes a reflector along said light path for causing a change in direction of said light path relative to a direction of said light input.

8. The device of claim 7 wherein said nonlinear light path intersects said reflector at a skew angle relative to a perpendicular to the reflector of at least approximately two degrees and less than an angle of total internal reflection.

9. The device of claim 7 wherein said means for providing a nonlinear light path includes waveguides which couple at said reflector to form a U-shaped folded light path, said waveguides being oriented with respect to a perpendicular to said reflector at skew angles which differ by at most approximately three degrees.

10. The device of claim 1 further comprising means for adjusting the amplitude of amplified light being emitted from said at least one output region.

11. The device of claim 1 wherein said means for providing a nonlinear light path includes waveguides which are curved.

12. The device of claim 1 wherein said means for providing a nonlinear light path includes at least one waveguide having a nonconstant width.

13. The device of claim 1 wherein said means for providing a nonlinear light path includes plural waveguides having constant but different widths.

14. The device of claim 1 wherein said means for providing a nonlinear light path includes at least one single transverse mode waveguide region.

15. The device of claim 1 wherein said means for providing a nonlinear light path includes at least one waveguide which is approximately U-shaped, such that said light path undergoes a substantial change of direction without reflection.

16. The device of claim 1 wherein said body includes multiple amplifier regions defined therein, said means for providing a nonlinear light path including a partially reflective, partially transmissive surface, said multiple amplifier regions providing multiple amplified light outputs emitted through said partially transmissive surface at said output region, said amplifier regions being optically coupled via light reflection at said partially reflective, partially transmissive surface.

17. The device of claim 1 wherein said body includes multiple amplifier regions optically coupled to one another, said means for pumping having individually addressable electrical contacts.

18. The device of claim 17 wherein said means for pumping includes at least one individually addressable electrical contact for the amplifier regions, each contact controlling both the amplitude and phase of light emitted from said amplifier region relative to light emitted from other amplifier regions.

19. The device of claim 17 wherein said means for pumping includes two individually addressable electrical contacts per amplifier region, one contact in each amplifier region controlling the amplitude of light emitted from said amplifier region relative to light emitted from other amplifier regions, the other contact in each amplifier region controlling the phase of light emitted from said amplifier region relative to light emitted from other amplifier regions.

20. The device of claim 19 wherein the phase control contact lies along a non-amplified portion of said light path.

21. The device of claim 1 wherein said input and output regions are located on opposed surfaces of said body.

22. The device of claim 1 wherein said input and output regions are located on a common surface of said body.

23. The device of claim 1 wherein said body includes transparent window regions adjacent to reflective surfaces of said body.

24. The device of claim 1 further comprising means in said body of optical gain material for suppressing laser oscillation in a lateral direction.

25. The device of claim 1 further comprising additional like devices which are stacked into a two-dimensional array of amplifiers, a coherent input beam and phase shifters being phased so as to provide a spatially coherent output beam from the two-dimensional array.

26. An optical amplifier device comprising,
   a body containing at least one optical gain region having an input region and at least one output region, said body having at least a first amplifier region defined within said body, said first amplifier region accepting a light input at said input region,
   at least one laser diode integral within said body for generating said light input,
   means for providing a nonlinear light path within said body, at least a portion of said light path passing through said first amplifier region,
   means for pumping said body of optical gain regions to cause amplification of light propagating in said light path, at least a portion of said amplified light being emitted from said output region or regions of said body.

27. The device of claim 26 wherein said at least one laser diode is wavelength tunable.

28. The device of claim 26 wherein said laser comprises an active gain region within said body bounded by Bragg reflector gratings.

29. The device of claim 26 wherein said laser comprises an active gain region within said body bounded by front and rear reflective facets, said active gain region having a light path defining waveguide oriented close to perpendicular to said facets, with a maximum skew angle between said waveguide and said perpendicular of approximately three degrees.

30. The device of claim 26 wherein said nonlinear light path in said body intersects a light path within said laser at a reflective facet.

31. The device of claim 26 wherein said nonlinear light path in said body intersects a light path within said laser at a shallow coupling angle, said intersecting nonlinear light path being curved.

32. The device of claim 26 wherein said nonlinear light path in said body intersects a light path in this said laser at a branching waveguide structure in a central area of said laser.

33. The device of claim 26 wherein said means for providing a nonlinear light path includes a reflector along said light path for causing a change in direction of said light path relative to a direction of light input from said at least one laser diode.

34. The device of claim 26 further comprising means for adjusting the phase of amplified light being emitted from said at least one output region.

35. The device of claim 34 including means for sensing and adjusting the output phase to create a single lobed output beam.

36. The device of claim 1 wherein the output beam or beams are electronically steerable.

37. The device of claim 26 further comprising an external phase shifter in the path of said emitted light for adjusting the phase of said emitted light.

38. The device of claim 26 wherein said means for providing a nonlinear light path includes a reflector along said light path for causing a change in direction of said light path relative to a direction of said light input.

39. The device of claim 38 wherein said nonlinear light path intersects said reflector at a skew angle relative to a perpendicular to the reflector of at least approximately two degrees and less than an angle of total internal reflection.

40. The device of claim 38 wherein said means for providing a nonlinear light path includes waveguides which couple at said reflector to form a U-shaped folded light path, said waveguides being oriented with respect to a perpendicular to said reflector at skew angles which differ by at most approximately three degrees.

41. The device of claim 26 further comprising means for adjusting the amplitude of amplified light being emitted from said at least one output region.

42. The device of claim 26 wherein said means for providing a nonlinear light path includes waveguides which are curved.

43. The device of claim 26 wherein said means for providing a nonlinear light path includes at least one waveguide having a nonconstant width.

44. The device of claim 26 wherein said means for providing a nonlinear light path includes plural waveguides having constant but different widths.

45. The device of claim 26 wherein said means for providing a nonlinear light path includes at least one single transverse mode waveguide region.

46. The device of claim 26 wherein said means for providing a nonlinear light path includes at least one waveguide which is approximately U-shaped, such that said light path undergoes a substantial change of direction without reflection.

47. The device of claim 26 wherein said body includes multiple amplifier regions defined therein, said means for providing a nonlinear light path including a partially reflective, partially transmissive surface, said multiple amplifier regions providing multiple amplified light outputs emitted through said partially transmissive surface at said output region, said amplifier regions being optically coupled via light reflection at said partially reflective, partially transmissive surface.

48. The device of claim 26 wherein said body includes multiple amplifier regions optically coupled to one another, said means for pumping having individually addressable electrical contacts.

49. The device of claim 48 wherein said means for pumping includes at least one individually addressable electrical contact for the amplifier regions, each contact controlling both the amplitude and phase of light emitted from said amplifier region relative to light emitted from other amplifier regions.

50. The device of claim 48 wherein said means for pumping includes two individually addressable electrical contacts per amplifier region, one contact in each amplifier region controlling the amplitude of light emitted from said amplifier region relative to light emitted from other amplifier regions, the other contact in each amplifier region controlling the phase of light emitted from said amplifier region relative to light emitted from other amplifier regions.

51. The device of claim 50 wherein the phase control contact lies along a non-amplified portion of said light path.

52. The device of claim 26 wherein said input and output regions are located on opposed surfaces of said body.

53. The device of claim 26 wherein said input and output regions are located on a common surface of said body.

54. The device of claim 26 wherein said body includes transparent window regions adjacent to reflective surfaces of said body.

55. The device of claim 26 further comprising means in said body of optical gain material for suppressing laser oscillation in a lateral direction.

56. The device of claim 26 further comprising additional like devices which are stacked into a two-dimensional array of amplifiers, a coherent input beam and phase shifters being phased so as to provide a spatially coherent output beam from the two-dimensional array.

57. An optical amplifier device comprising,
a body of optical gain material having opposed front and rear facets, said front facet having a low reflectivity, said rear facet having a high reflectivity, said body having at least a first amplifier region defined therein between said front and rear facets, said first amplifier region accepting a light input through one of said facets, said light propagating in said first amplifier region of said body along a light path incident on said rear facet at an angle other than normal to said rear facet, and
means for pumping said body of optical gain material to cause amplification of said light propagating in said light path, at least a portion of said amplified light being emitted from said front facet of said body.

58. The device of claim 57 wherein said means for pumping comprises broad area conductive contacts on top and bottom surfaces of said body of optical gain material.

59. The device of claim 57 wherein said means for pumping provides a spatially confined pump current to said body to provide a gain guided waveguide for said light.

60. The device of claim 57 wherein said body of optical gain material includes a real refractive index waveguide defined therein along said folded light path.

61. The device of claim 60 wherein said waveguide supports a single mode of light propagation.

62. The device of claim 60 wherein said waveguide supports multiple light propagation modes.

63. The device of claim 57 wherein said front facet has an antireflection coating thereon.

64. The device of claim 57 wherein a window region is formed in said body proximate to at least one of said facets.

65. The device of claim 57 wherein said incidence angle of light on said rear facet is in a range from about 2° to about 10° from normal.

66. The device of claim 65 wherein said incidence angle is between 5 and 7 degrees from normal.

67. The device of claim 57 wherein there are multiple amplifier regions defined in said body of optical gain material, each amplifier region other than said first amplifier region receiving a light input from a preceding adjacent amplifier region via partial reflection of amplified light from said front facet of said body, the angle of incidence of light propagating in said amplifier regions upon said front facet being other than normal to said facet.

68. The device of claim 57 wherein each of said amplifier regions has separate conductive contacts electrically isolated from contacts of adjacent amplifier regions, whereby said means for pumping is individually addressable with respect to said multiple amplifier regions.

69. The device of claim 57 further comprising means in said body of optical gain material for suppressing laser oscillation in lateral direction.

70. The device of claim 69 wherein said suppressing means comprises at least one V-groove formed in said body extending substantially from front facet to rear facet.

71. The device of claim 57 further comprising additional like devices which are stacked into a two-dimensional array of amplifiers, a coherent input beam and phase shifters being phased so as to provide a spatially coherent output beam from the two-dimensional array.

72. A master oscillator power amplifier device comprising,
a semiconductor laser diode providing a coherent light beam,
at least one amplifier region formed of a semiconductor heterostructure providing optical gain for said light beam, said amplifier having a high reflectivity rear facet and a low reflectivity front facet, said amplifier having at least a first amplifier region accepting said light beam, said coherent light beam propagating in said first amplifier region of said amplifier along a light path that is folded into a V-shape by reflection of said light beam at said rear facet, and
means for pumping said amplifier to cause amplification of said coherent light beam as it propagates in said light path, at least a portion of said amplified light beam being emitted from said front facet cf said amplifier.

73. The master oscillator power amplifier device of claim 72 wherein said semiconductor laser diode and said amplifier are monolithically integrated on a common substrate.

74. The master oscillator power amplifier device of claim 73 wherein said semiconductor laser diode includes feedback gratings.

75. The master oscillator power amplifier device of claim 72 wherein said amplifier has multiple amplifier regions, each amplifier region being substantially identical to said first amplifier region, each amplifier region other than said first amplifier region adapted to accept a coherent light beam from a preceding adjacent amplifier region via partial reflection of amplified light from said front facet of said amplifier, the angle of incidence of light propagating in said multiple amplifier regions upon said front and rear facets being other than normal to said facets.

76. The master oscillator power amplifier device of claim 75 wherein said means for pumping includes separate conductive contacts for each of said multiple amplifier regions, said contacts being electrically isolated from contacts of adjacent amplifier regions, whereby said means for pumping is individually addressable with respect to said multiple amplifier regions.

77. The master oscillator power amplifier device of claim 75 wherein the laser is a single transverse mode laser.

78. The master oscillator power amplifier device of claim 72 wherein the amplifier regions are waveguides capable of supporting only a single transverse mode.

79. The master oscillator power amplifier device of claim 72 wherein said semiconductor heterostructure of said amplifier includes a real refractive index waveguide defined therein along the folded light path of each amplifier region.

80. The master oscillator power amplifier device of claim 79 wherein said waveguide supports a single mode of light propagation.

81. The master oscillator power amplifier device of claim 79 wherein said waveguide supports multiple light propagation modes.

82. The master oscillator power amplifier device of claim 79 wherein said light path is incident on said rear facet at an angle of at most 10 from normal.

83. The master oscillator power amplifier device of claim 79 wherein said semiconductor laser diode is wavelength tunable.

84. The device of claim 72 further comprising additional like devices which are stacked into a two-dimensional array of amplifiers, a coherent input beam and phase shifters being phased so as to provide a spatially coherent output beam from the two-dimensional array.

85. An integrated master oscillator power amplifier device comprising,
a substrate,
a semiconductor laser diode formed on said substrate having an electrically pumped active gain region and grating means for providing feedback of light generated in said active gain region, said laser providing a laser light beam output from said gain region, an amplifier formed on said substrate having a zig-zag shaped waveguide connected to said laser to receive said laser light and disposed between a front partially reflective facet of said substrate and means formed on said substrate at a back side of said zig-zag shaped waveguide for providing high reflectivity, said waveguide being electrically pumpable to provide amplification of said laser light.

86. The device of claim 85 wherein said high reflectivity means comprises a facet formed on said substrate.

87. The device of claim 85 wherein at least one phase shift means is provided along the path of said light.

88. An optical amplifier device comprising a body of optical gain material having a low reflectivity front facet with an input region and an output region, the body also having an amplifier region defined therein accepting light input through the front facet at the input region thereof, means within said body for providing a nonlinear light path passing through the amplifier region, said light path providing means including a pair of waveguides, a first one of said waveguides extending from said input region of the front facet to a rear end of said body and supporting only a single transverse mode of light propagation, a second one of said waveguides extending from said rear end of said body proximate to said first waveguide to said output region of the front facet, said second waveguide having a greater width than said first waveguide, said light path providing means also including means at said rear end of said body proximate to said pair of waveguides for coupling light propagating in said first waveguide into said second waveguide, and means for electrically pumping said body to cause amplification of light in said light path, said amplified light being emitted from said second waveguide at said output region of said front facet.

89. The amplifier device of claim 88 wherein said pair of waveguides are real refractive index waveguides.

90. The amplifier device of claim 88 wherein said pair of waveguides include means for spatially confining pump current provided by said electrical pumping means, whereby said waveguides are gain guiding waveguides.

91. The amplifier device of claim 88 wherein said second waveguide is capable of supporting multiple light propagation modes.

92. The amplifier device of claim 91 wherein said second waveguide is a broad area waveguide.

93. The amplifier device of claim 88 wherein said front facet is antireflection coated.

94. The amplifier device of claim 88 wherein said coupling means comprises a Bragg reflector grating for causing a change of direction of the light path relative to the direction of light input.

95. The amplifier device of claim 88 wherein said first and second waveguides meet at said rear end of said body proximate to said coupling means at an angle of at most 20 degrees.

96. A master oscillator power amplifier (MOPA) device comprising, a semiconductor heterostructure body having a low reflectivity front facet, said body including a semiconductor laser diode monolithically integrated within said body and an amplifier region also formed within said body, means within said body for providing a nonlinear light path through said amplifier region, said light path providing means including of waveguides first one of said waveguides accepting light coupled from said laser diode thereinto and extending from a coupling region proximate to said laser diode to a rear end of said body, said first waveguide supporting only a single transverse mode of light propagation, a second one of said waveguides extending from said rear end of said body proximate to said first waveguide to an output region of said front facet of said body, said second waveguide having a greater width than said first waveguide, said light path providing means also including means at said rear end of said body proximate to said pair of waveguides for coupling light propagating in said first waveguide into said second waveguide, and means for electrically pumping said body to cause operation of said laser diode, whereby a coherent light beam is generated and coupled into said first waveguide, and to cause amplification of light in said light path, said amplified light being emitted from said second waveguide at said output region of said front facet.

97. The MOPA device of claim 96 wherein said laser diode comprises a waveguiding active gain region bounded by Bragg reflector gratings.

98. The MOPA device of claim 96 wherein said light path in said first waveguide intersects a light propagation path inside said laser diode at a branching waveguide structure in a central region of said laser diode, whereby laser light is coupled into said first waveguide.

99. The MOPA device of claim 96 wherein said pair of waveguides are real refractive index waveguides.

100. The amplifier device of claim 96 wherein said pair of waveguides include means for spatially confining pump current provided by said electrical pumping means, whereby said waveguides are gain guiding waveguides.

101. The amplifier device of claim 96 wherein said second waveguide is capable of supporting multiple light propagation modes.

102. The amplifier device of claim 101 wherein said second waveguide is a broad area waveguide.

103. The amplifier device of claim 96 wherein said front facet is antireflection coated.

104. The amplifier device of claim 96 wherein said coupling means comprises a Bragg reflector grating for causing a change of direction of the light path relative to the direction of light input.

105. The amplifier device of claim 96 wherein said first and second waveguides meet at said rear end of said body proximate to said coupling means at an angle of at most 20 degrees.

* * * * *

UNITED STATES PATENT AND TRADEMARK OFFICE
CERTIFICATE OF CORRECTION

PATENT NO. : 5,088,105

DATED : February 11, 1992

INVENTOR(S) : Donald R. Scifres et al.

It is certified that error appears in the above-identified patent and that said Letters Patent is hereby corrected as shown below:

Column 1, line 4, below the title, please insert the following:
-- Statement as to Rights to Invention Made Under Federally Sponsored Research and Development The invention was made with government support under Contract No. F29601-87-C-0028 awarded by the United States Air Force. The Government has certain rights in the invention. --

Column 1, line 64, "substratedown" should read
-- substrate-down --.

Column 7, line 65, "dashed lines 10 131" should read
-- dashed lines 131 --.

Column 9, line 60, "oriented at an angle 8" should read
-- oriented at an angle $\theta$ --; line 61, "the angles $\phi$ and that" should read -- the angles $\phi$ and $\psi$ that --.

Column 11, line 7, "rear facet 28!" should read
-- rear facet 281 --; line 21, "light output regions 298 is" should read -- light output regions 298 are --.

UNITED STATES PATENT AND TRADEMARK OFFICE
CERTIFICATE OF CORRECTION

PATENT NO. : 5,088,105
DATED : February 11, 1992
INVENTOR(S) : Donald R. Scifres et al.

It is certified that error appears in the above-identified patent and that said Letters Patent is hereby corrected as shown below:

Claim 82, column 18, line 51, "an angle of at most 10 from normal" should read -- an angle of at most 10° from normal --.

Claim 96, column 20, lines 10-11, "including of waveguides first one of said waveguides accepting" should read -- including a pair of waveguides, a first one of said waveguides accepting --.

Signed and Sealed this

Fifth Day of January, 1993

Attest:

DOUGLAS B. COMER

*Attesting Officer*      Acting Commissioner of Patents and Trademarks